United States Patent
Saeki

(10) Patent No.: US 6,177,823 B1
(45) Date of Patent: Jan. 23, 2001

(54) PINCER MOVEMENT DELAY CIRCUIT FOR PRODUCING OUTPUT SIGNAL DIFFERENT IN REPETITION PERIOD FROM INPUT SIGNAL

(75) Inventor: Takanori Saeki, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/055,126

(22) Filed: Apr. 6, 1998

(30) Foreign Application Priority Data

Apr. 4, 1997 (JP) .................................................. 9-102624

(51) Int. Cl.[7] .................................................. H03H 11/26
(52) U.S. Cl. ............................ 327/277; 327/261; 327/117
(58) Field of Search .................................... 327/277, 117, 327/140–149, 158, 260–269, 160–169, 115, 261; 377/47, 48

(56) References Cited

U.S. PATENT DOCUMENTS

| | | | |
|---|---|---|---|
| 5,355,037 | * 10/1994 | Andresen | 327/159 |
| 5,430,394 | * 7/1995 | Mcminn | 327/292 |
| 5,475,322 | * 12/1995 | MacDonald | 326/93 |
| 5,528,187 | * 6/1996 | Sato et al. | 327/292 |
| 5,570,294 | * 10/1996 | Mcminn | 364/481 |
| 5,699,003 | * 12/1997 | Saeki | 327/261 |
| 5,712,583 | * 1/1998 | Frankeny | 327/158 |

FOREIGN PATENT DOCUMENTS 8-237091     9/1996 (JP) .

* cited by examiner

*Primary Examiner*—Terry D. Cunningham
*Assistant Examiner*—Hai L. Nguyen
(74) *Attorney, Agent, or Firm*—Sughrue, Mion, Zinn, Macpeak & Seas, PLLC

(57) ABSTRACT

A delay circuit has a first delay line propagating an input pulse from stage to stage in one direction, a second delay line propagating the previous input pulse from stage to stage in the opposite direction and a comparator operative compare output potential levels of the stages incorporated in the first delay line with output potential levels of the stages incorporated in the second delay line so as to determine if any pair of output potentials are consistent in logic level with one another; when the output potentials are consistent with one another, an output timing signal is produced, and the pulse repetition period of the output timing signal is exactly half as long as that of the input pulse signal.

16 Claims, 3 Drawing Sheets

PINCER MOVEMENT DELAY CIRCUIT FOR PRODUCING OUTPUT SIGNAL DIFFERENT IN REPETITION PERIOD FROM INPUT SIGNAL

FIELD OF THE INVENTION

This invention relates to a delay circuit and, more particularly, to a pincer movement delay circuit for producing an output signal different in pulse repetition period from an input signal.

DESCRIPTION OF THE RELATED ART

The present inventor proposed a synchronous delay circuit in Japanese Patent Publication of Unexamined Application (JPA) No. 8-237091. The prior art synchronous delay circuit produces a timing signal at a half of clock repetition period of a clock signal. FIG. 1 illustrates the prior art delay circuit already proposed by the present inventor.

The delay circuit comprises a first delay line 1, a second delay line 2 and a transfer circuit 3 connected between the first delay line 1 and the second delay line 2. The first delay line 1 is implemented by a series of delay elements, and the second delay line 2 is implemented by two series combination of delay elements. The transfer circuit 3 includes transfer gates arranged in parallel. The transfer gates have respective input nodes connected to the delay elements of the first delay line I and respective output nodes selectively connected to the delay elements of the two series combinations.

A clock signal CLK1 is supplied from an input terminal 4 to a signal receiving circuit 5, and the signal receiving circuit 5 produces a clock signal CLK2 from the clock signal CLK1. The clock signal CLK2 is directly supplied to the transfer circuit 3 as a control signal CTL1, and is supplied through a delay circuit 6 to the first delay line 1.

The first delay line 1 rightwardly propagates the clock signal CLK2 through the delay elements. The transfer circuit 3 is responsive to the control signal CTL1 so as to selectively transfer a group of clock signals CLK2 from the delay elements of the first delay line 1 to the delay elements of the second delay line 2. The second delay line 2 leftwardly propagates the group of clock signals CLK2 through the delay elements, and an OR gate 7 produces an output clock signal CLK3 from the group of clock signals CLK2.

The second delay line 2 is designed to introduce delay half as long as the delay introduced by the first delay line 1. Each clock pulse CLK2 proceeds to a certain point of the first delay line 1 during the clock repetition period, and the next clock pulse CLK2 causes the transfer circuit 3 to transfer the clock pulse CLK2 to one of the two series combinations of the second delay line 2. Then, the clock pulse CLK2 is output from the second delay line 2 at the mid timing of the clock period. For this reason, the prior art delay circuit requires the first delay line 1 and the second delay line 2 exactly designed to introduce the two kinds of delay, and the Japanese Patent Publication of Unexamined Application proposes to regulate the number of the delay elements to 2:1. In other words, the output timing of the clock signal CLK3 is dependent on the circuit configuration of the first and second delay lines 1 and 2. However, even if the delay elements are selected to 2:1, the layout of the delay lines ½ are not taken into account, and a certain layout does not make the two kinds of delay time 2:1. This means that the output timing of the clock signal CLK3 is offset from the mid point of the clock repetition period.

SUMMARY OF THE INVENTION

It is therefore an important object of the present invention to provide a delay circuit, which accurately produces an output pulse at a target timing.

In accordance with one aspect of the present invention, there is provided a delay circuit for producing an output timing signal from an input signal, and the delay circuit comprises a first delay line having a first node group implemented by a plurality of first nodes connected in series and propagating the input signal from an initial node of the first node group toward a final node of the first node group, a second delay line having a second node group implemented by a plurality of second nodes connected in series, propagating the input signal from an initial node of the second node group toward a final node of the second node group causing the initial node to the final node of the first node group to be respectively paired with the final node to the initial node of the second node group so as to form a plurality of node pairs and a comparator connected to the plurality of node pairs, and comparing outputs of the plurality of node pairs to see whether the outputs of any one of the plurality of node pairs are consistent with each other so as to determine a timing for producing the output timing signal.

BRIEF DESCRIPTION OF THE DRAWINGS

The features and advantages of the delay circuit will be more clearly understood from the following description taken in conjunction with the accompanying drawings in which.

DESCRIPTION OF THE PREFERRED EMBODIMENT

Figure 1:
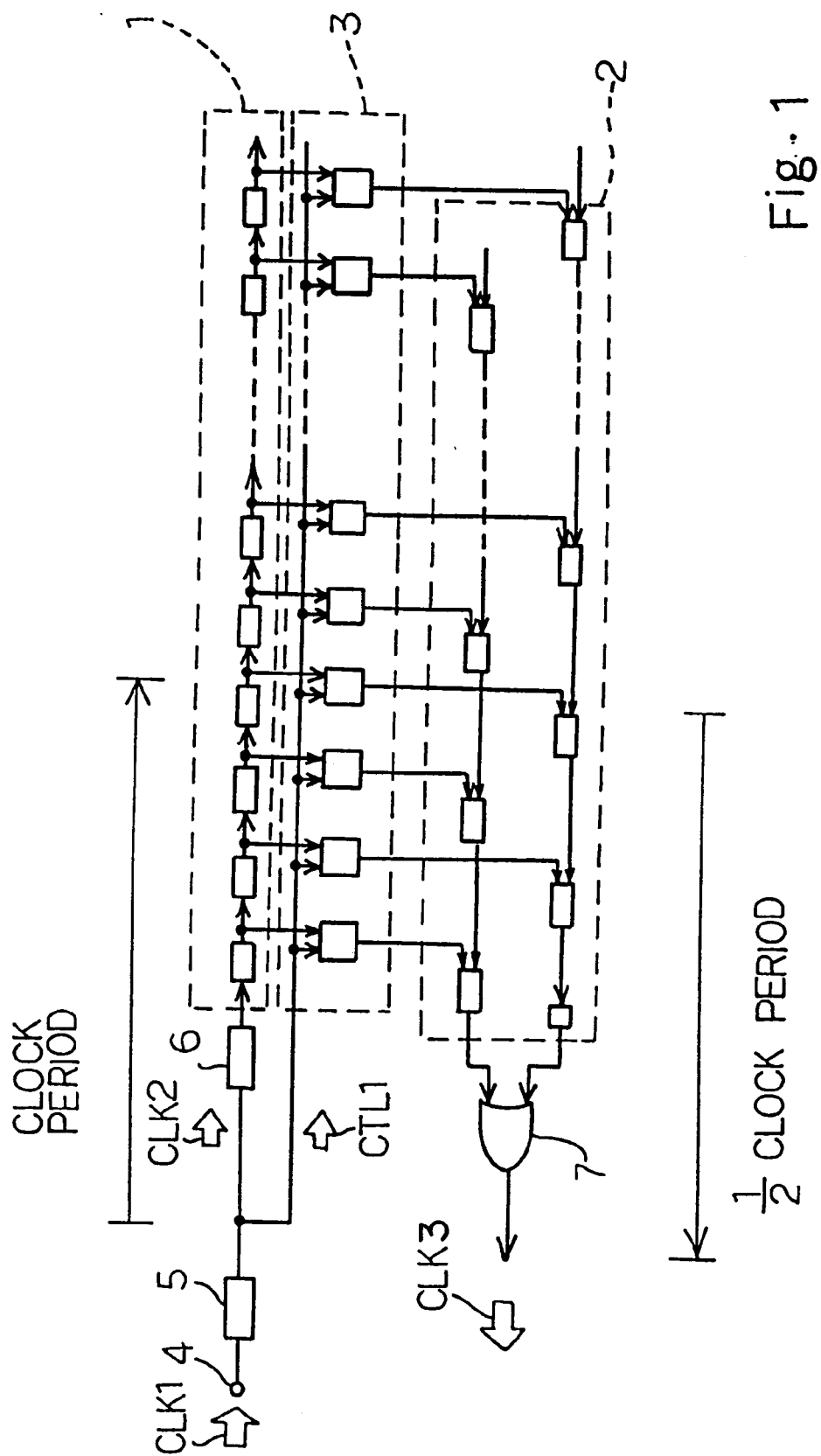
FIG. 1 is a circuit diagram showing the prior art delay circuit disclosed in Japanese Patent Publication of Unexamined Application No. 8-237091.
Figure 2:
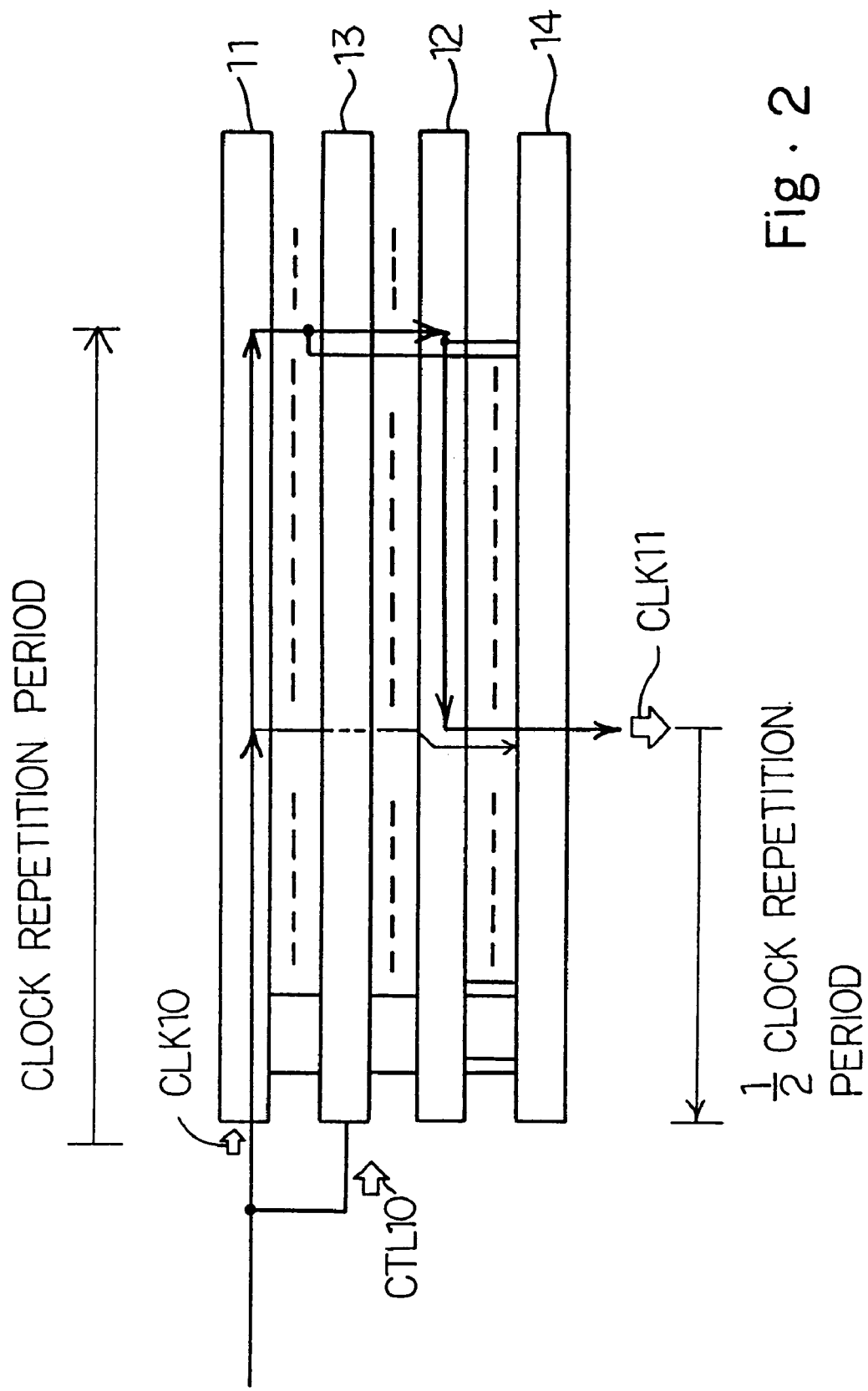
FIG. 2 is a schematic view showing a delay circuit according to the present invention.

Referring first to FIG. 2 of the drawings, a delay circuit embodying the present invention comprises a first delay line 11 for rightwardly propagating an input clock signal CLK10, a second delay line 12 for leftwardly propagating the clock signal CLK10, a transfer circuit 13 connected between the first delay line 11 and the second delay line 12 for transferring a group of clock signal CLK10 from the first delay line 11 to the second delay line 12 and a comparator 14 connected to the first delay line 11 and the second delay line 12 for producing an output clock signal CLK11. The transfer circuit 13 is responsive to the next clock signal CLK10 serving as a timing control signal CTL10, and transfers the group of clock signal CLK10 from the first delay line 11 to the second delay line 12. The second delay line 12 propagates the group of clock signals CLK10 in the opposite direction to the first delay line 11, and supplies the group of clock signals CLK10 to the comparator 14. The first delay line 11 supplies the next group of clock signals CLK10 to the comparator 14, and comparator 14 compares the clock signals CLK10 with the next clock signals CLK10, and produces the output clock signal CLK11 in the concurrent presence of the clock signal CLK10 and the next clock signal CLK10. The comparator 14 is designed to produce the output clock signal CLK11 at a certain timing when the clock repetition period of the output clock signal CLK11 is half of the clock repetition period of the clock signal CLK10.

Figure 3:
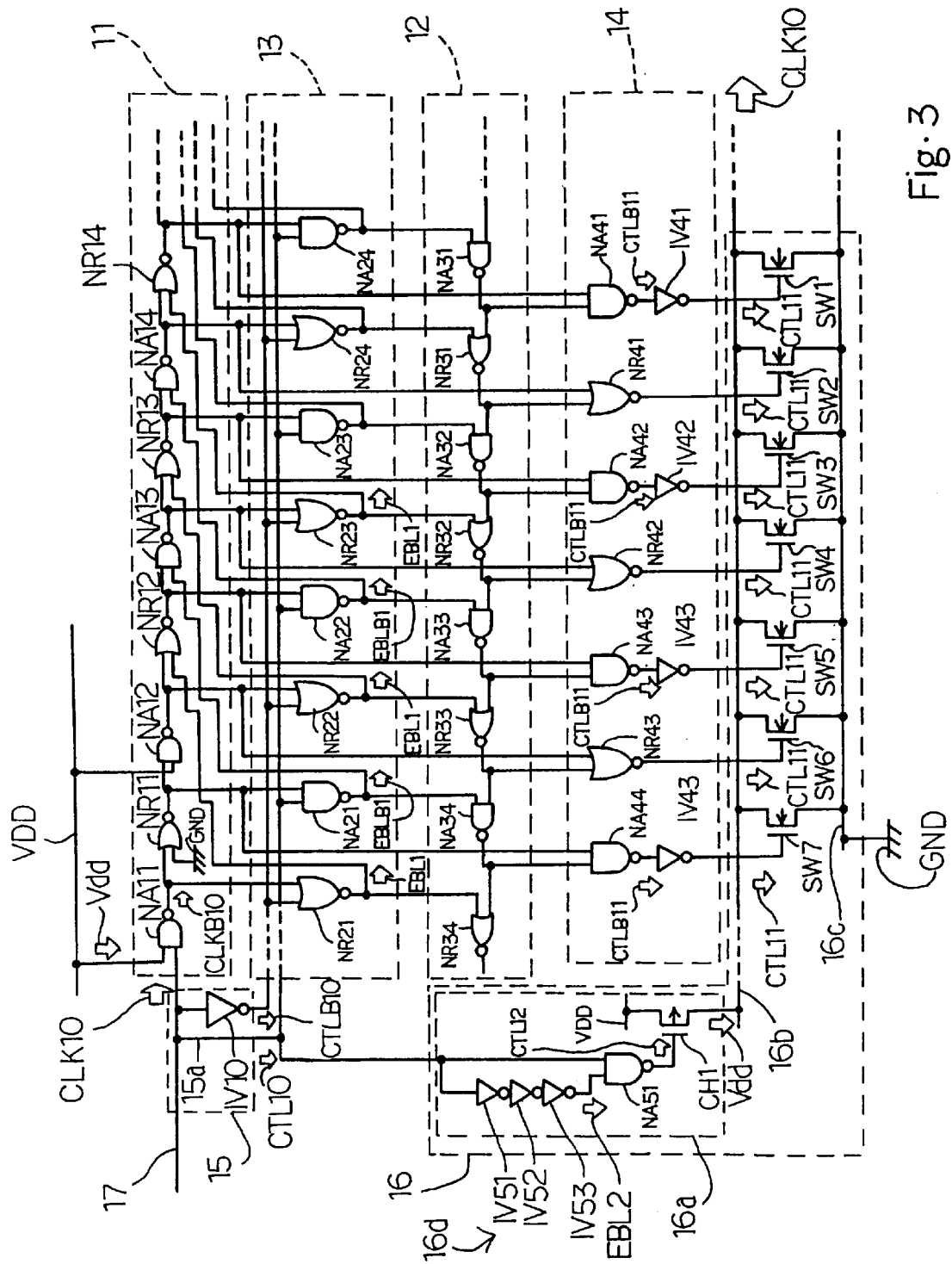
FIG. 3 is a circuit diagram showing the circuit configuration of the delay circuit.

FIG. 3 illustrates the detailed circuit configuration of the delay circuit. A controller 15 and a wired-OR gate 16 are further incorporated in the delay circuit. In the following description, a high voltage level and a low voltage level are assumed to be equivalent to logic "1" level and logic "0" level, respectively.

The first delay line 11 includes NAND gates NA11, NA12, NA13, NA14, ... and NOR gates NR11, NR12, NR13, NR14, ... The NAND gates NA11 to NA14 ... are alternated with the NOR gates NR11 to NR14 ..., and the NAND gates NA11 to NA14 and the NOR gates NR11 to NR14 are connected in series to the next NOR gates NR11 to NR14 and the next NAND gates NA11 to NA14. The NAND gates NA11 to NA14 and the NOR gates NR11 to NR14 serve as delay elements, respectively, and the NAND/NOR gates NA11/NR11/NA12/NR12/NA13/NR13/NA14/NR14 in the first delay line 11 are numbered as the first delay element, the second delay element, the third delay element, ... and the eighth delay element.

The NAND gate NA11 has two input nodes. One of the two input nodes is connected to a positive power voltage line VDD, and is fixed to logic "1" level. For this reason, the NAND gate NA11 is enabled at all times, and inverts a potential level/logic level at the other input node. The clock signal CLK10 is supplied to the other input node, and, accordingly, the NAND gate NA11 produces the complementary clock signal CLKB10 at the output node thereof. A piece of delay is introduced between the arrival of the clock signal CLK10 at the other input node and the production of the complementary clock signal CLKB10 at the output node. The complementary clock signal CLKB10 is supplied to the NOR gate NR11 and the transfer circuit 13.

The NOR gate NR11 also has two input nodes. One of the two input nodes is connected to a ground line, and is fixed to logic "0" level. The other input node is connected to the output node of the NAND gate NA11. For this reason, the NOR gate NR11 is enabled at all times, and inverts the potential level or logic level at the other input node. A piece of delay is introduced between the arrival of the complementary clock signal CLKB10 at the input node and the reproduction of the clock signal CLK10 at the output node thereof, and the reproduced clock signal CLK10 is supplied to the NAND gate NA12 and the transfer circuit 13.

The positive high voltage level and the reproduced clock signal CLK10 are supplied to the two input nodes of the NAND gate NA12, and supplies the complementary clock signal CLKB10 to the NOR gate NR12 and the transfer circuit 13. The NAND gate NA12 also introduces a piece of delay.

The transfer circuit 13 supplies an enable signal EBL1 and the complementary enable signal EBLB1 to the NOR gates NR12/NR13/NR14 and the NAND gates NA13/NA14. The NOR gates NR12/NRl3/NR14 become responsive to the clock/complementary clock signal CLK10/CLKB10 in the presence of the enable signal of the low level, and the complementary enable signal EBLB1 of the high level make the NAND gates NA13/NA14 responsive to the clock/complementary clock signal CLK10/CLKB10. Thus, the NOR gates NR12/NR13/NR14 and the NAND gates NA13/NA14 concurrently become responsive to the clock/complementary clock signals CLK10/CLKB10.

The controller 15 includes a signal path 15a and an inverter IV10, and the signal path 15a and the inverter IV10 are arranged in parallel. The signal path 15a is connected to an input clock signal line 17, and the input node of the inverter IV10 is also connected to the input clock signal line 17. For this reason, the controller 15 produces a control signal CTL10 of active low level and the complementary control signal CTLB10 from the clock signal CLK10, and supplies the control signal CTL10 and the complementary control signal CTLB10 to the transfer circuit 13.

When the control signal CTL10 is in the low level and, accordingly, the complementary control signal CTLB10 is in the high voltage level, the transfer circuit 13 supplies the enable signal EBL1 of the active low level and the complementary enable signal EBLB1 of the high level to the NOR gates NR12/NR13/NR14 and the NAND gates NA13/NA14, and the clock signal/complementary clock signals CLK10/CLKB10 are rightwardly propagated through the NOR/NAND gates NR12/NA13/NR13/NA14/NR14.

The transfer circuit 13 includes two-input NOR gates NR21/NR22/NR23/NR24 and two-input NAND gates NA21/NA22/NA23/NA24 arranged in parallel, and the NOR gates NR21/NR22/NR23/NR24 are alternated with the NAND gates NA21/NA22/NA23/NA24, respectively. The control signal CTL10 is supplied to the NAND gates NA21/NA22/NA23/NA24, and the complementary control signal CTLB10 is supplied to the NOR gate NR21/NR22/NR23/NR24. The input nodes of the NOR gates NR21/NR22/NR23/NR24 are respectively connected to the output nodes of the NAND gates NA11/NA12/NA13/NA14, and the input nodes of the NAND gates NA21/NA22/NA23/NA24 are connected to the output nodes of the NOR gates NR11/NR12/NR13/NR14, respectively. The NOR/NAND gates NA21/NA21/NR22/NA22/NR23/NA23/NR24/NA24 are numbered as first comparing element, the second comparing element, the third comparing element, ... and the eighth comparing element, and the first comparing element to the eighth comparing element are respectively corresponding to the first delay element to the eighth delay element, respectively.

The control signal CTL10 of the low level and the complementary control signal CTLB10 of the high level make the NAND gates NA21/NA22/NA23/NA24 and the NOR gates NR21/NR22/NR23/NR24 responsive to the clock signal/complementary clock signal CLK10/CLKB10. The NAND gates NA21/NA22/NA23/NA24 and the NOR gates NR21/NR22/NR23/NR24 invert the clock signal/complementary clock signal CLK10/CLKB10, and supplies the inverted signals CLKB10/CLK10 to the second delay line 12. The NOR gates NR21/NR22/NR23/NR24 and the NAND gates NA21/NA22/NA23/NA24 supply the enable signal EBLI and the complementary enable signal EBLB1 to the NOR gates NR12/NR13/NR14 and the NAND gates NA13/NA14. Each of the NOR/NAND gates NR21/NA21/NR22/NA22/NR23 supplies the enable/complementary enable signal EBL1/EBLB1 to every third delay element from the corresponding delay element of the first delay line 11.

The second delay line 12 includes two-input NAND gates NA31/NA32/NA33/NA34 and two-input NOR gates NR31/NR32/NR33/NR34, and the NAND gates NA31/NA32/NA33/NA34 are alternated with the NR gates NR31/NR32/NR33/NR34, respectively. The NAND gates NA31/NA32/NA33/NA34 and the NOR gates NR31/NR32/NR33/NR34 are connected in series to the next NOR gates NR31/NR32/NR33/NR34 and the next NAND gates NA31/NA32/NA33/NA34. The NAND gates NA24/NA23/NA22/NA21 supply the clock/complementary clock signals CLK10/CLKB10 to the NAND gates NA31/NA32/NA33/NA34, and the NOR gates NR24/NR23/NR22/NR21 supply the clock/complementary clock signals CLK10/CLKB10 to the NOR gates NR31/NR32/NR33/NR34. The series of NAND/NOR gates NA31/NR31/NA32/NR32/NA33/NR33/NA34/NR34 leftwardly propagates the clock/complementary clock signals CLK10/CLKB10, and the NAND/NOR gates NA31/

NR31/NA32/NR32/NA33/NR33/NA34/NR34 introduce pieces of delay into the propagation of the clock/complementary clock signals CLK10/CLKB10. The NAND/NOR gates NA31/NR31/NA32/NR32/NA33/NR33/NA34/NR34 are numbered as the first delay element, the second delay element, ... and the eighth delay element, and the eighth delay element to the first delay element in the second delay line 12 are corresponding to the first delay element to the eighth delay element of the first delay line 11, respectively. Thus, the first delay element NA11 to the eighth delay element NR14 are respectively paired with the eighth delay element NA31 to the first delay element NR34, and the eighth delay element NR34 to the first delay element NA11 in the first delay line 11 and the first delay element NA31 to the eighth delay element NR34 in the second delay line 12 form a first delay element pairs NR14/NA31 to an eighth delay element pair NA11/NR34, respectively.

The comparator 14 includes two-input NAND gates NA41/NA42/NA43/NA44 arranged in parallel, two-input NOR gates NR41/NR42/NR43/NR44 alternated with the NAND gates NA41/NA42/NA43 and inverters IV41/IV42/IV43/IV44 connected in series to the NAND gates NA41/NA42/NA43/NA44, respectively. The output nodes of the NAND gates NA31/NA32/NA33/NA34 are connected to the input nodes of the NAND gates NA41/NA42/NA43/NA44, respectively, and the output nodes of the NOR gates NR14/NR13/NR12/NR11 are respectively connected to the other input nodes of the NAND gates NA41/NA42/NA43/NA44. On the other hand, the output nodes of the NOR gates NR31/NR32/NR33/NR34 are connected to the input nodes of the NOR gates NR41/NR42/NR43/NR44, respectively, and the output nodes of the NAND gates NA14/NA13/NA12 are respectively connected to the other input nodes of the NOR gates NR41/NR42/NR43/NR44. Thus, the first delay line 11 and the second delay line 12 supply the clock/complementary clock signals CLK10/CLKB10 to the comparator 14. The NAND/NOR gates NA41/NR41/NA42/NR42/NA43/NR43/NA44 are numbered as the first comparing element, the second comparing element, ... and the seventh comparing element, and the first comparing element NA41 to the seventh comparing element NA44 respectively compare the potential levels respectively supplied from the first delay element pair NR14/NA31 to the seventh delay element pair NR11/NA34.

Each of the NOR gates NR41 to NR43 compares the potential levels at the output nodes of the delay elements in the first delay line 11 with the potential levels at the output nodes of the delay elements in the second delay line 12 to determine whether or not both input potential levels are corresponding to logic "0" level. If both potential levels correspond to logic "0" level, the NOR gate NR41 to NR43 produces a control signal CTL11 of the positive high voltage level Vdd, and supplies it to the wired-OR gate 16.

On the other hand, each of the NAND gates NA41 to NR44 compares the potential levels at the output nodes in the first delay line 11 with the potential levels at the output nodes in the second delay line 12 to determine whether or not both potential levels are corresponding to logic "1" level. If both potential levels correspond to logic "1" level, the NAND gate NA41 to NA44 produces a complementary control signal CTLB11 of the low level, and supplies it to the associated inverter IV41/IV42/IV43. The inverters IV41 to IV43 produce the control signal CTL11 from the complementary control signal CTLB11, and supply it to the wired-OR gate 16.

The wired-OR gate 16 includes a current supplier 16a, an output clock signal line 16b, a discharging line 16c and n-channel enhancement type switching transistors SW1, SW2, SW3, SW4, SW5, SW6 and SW7 connected in parallel between the output clock signal line 16b and the discharging line 16c. The n-channel enhancement type switching transistors SW1/SW3/SW5/SW7 are gated by the inverters IV41/IV42/IV43/IV44, respectively, and the other n-channel enhancement type switching transistors SW2/SW4/SW6 are respectively gated by the NOR gates NR41/NR42/NR43/NR44.

The current supplier 16a includes a p-channel enhancement type charging transistor CH1 connected between the positive power voltage line VDD and the output clock signal line 16b, a delay line 16d implemented by a series combination of inverters IV51/IV52/IV53 and a two-input NAND gate NA51 enabled by the delay line 16d. One of the two input nodes of the NAND gate NA51 is directly connected to the controller 15, and the other input node is connected through the delay line 16d to the controller 15. The control signal CTL10 is supplied to the NAND gate NA51 and the delay line 16d. An odd number of inverters IV51/IV52/IV53 form the delay line 16d, and supplies an enable signal EBL2 to the NAND gate NA51. The NAND gate NA51 is enabled with the enable signal EBL2 of the high voltage level, and changes a control signal CTL12 to the low voltage level for certain time period after change of the control signal CTL10 from the low voltage level to the high voltage level. The control signal CTL12 of the low voltage level causes the p-channel enhancement type charging transistor CH1 to turn on, and the p-channel enhancement type charging transistor CH1 pulls up the output clock signal line 16b to the positive power voltage level Vdd. After the certain lapse of time, the delay line 16d changes the enable signal EBL2 to the low voltage level, and the NAND gate NA51 recovers the control signal CTL12 to the inactive high level. Then, the output clock signal line 16b is isolated from the positive power voltage line VDD.

Thereafter, the n-channel enhancement type switching transistors SW1 to SW7 are gated by the comparator 14, and the positive power voltage Vdd is discharged from the output clock signal line 16b through at least one of the n-channel enhancement type switching transistors SW1 to SW7 so as to change the potential level of the output clock signal CTL11.

Assuming now that a clock pulse CLK10-1 and the next clock pulse CLK10-2 change the input clock signal line 17 to the high voltage level at interval, the first delay line 11 propagates the clock pulse CLK10-1 of the high voltage level from the first delay element NA11 toward the eighth delay element NA14. The controller 15 supplies the control signal CTL10 of the low level and the complementary control signal CTLB10 of the high level to the NAND gates NA21/NA22 and the NOR gates NR21/NR22/NR23 between the trailing edge of the clock pulse CLK10-1 and the leading edge of the next clock pulse CLK10-2. The control signal CTL10 of the low level and the complementary control signal CTLB10 of the high level disable the NAND gates NA21/NA22/NA23/NA24 and the NOR gates NR21/NR22/NR3/NR24, and the comparator does not transfer the potential levels at the output node of the NAND/NOR gates NA11 to NR14 in the first delay line 11 to the second delay line 12. However, the NOR gates NR21/NR22/NR23 and the NAND gates NA21/NA22 supply the enable signal EBL1 of the low level and the complementary enable signal EBLB1 of the high level to the associated NOR gates NR12/NR13/NR14 and the associated NAND gates NA13/NA14, and allow the first delay line 11 to propagate the clock pulse CLK10-1 and the complementary clock pulse CLKB-1 from the delay element to the next delay element.

When the next clock pulse CLK10-2 changes the input clock signal line 17 to the high voltage level, the controller 15 changes the control signal CTL10 and the complementary control signal CTLB10 to the high voltage level and the low voltage level, respectively, and enable the transfer circuit 13. Then, the transfer circuit 13 inverts the potential levels at the output node of the first delay element NA1 to the output node of the eighth delay element NR14, and supplies the inverted potential levels to the input node of the eighth delay element NR34 to the input node of the first delay element NA31.

The second delay line 12 propagates the clock pulse/complementary clock pulse CLK10-1/CLKB10-1 toward the eighth delay element NR34, and the potential level is sequentially changed from the first delay element NA31 toward the eighth delay element NR34. On the other hand, the first delay line 11 propagates the clock pulse/complementary clock pulse CLK10-2/CLK10-2 toward the eighth delay element NR14, and the potential level at the output node is sequentially changed from the first delay element NA11 toward the eighth delay element NA14. The first delay element pair NR14/NA31 to the seventh delay element pair NR11/NA34 continuously supply the pairs of potential levels to the first comparing element NA41 to the seventh comparing element NA44, and the first comparing element NA41 to the seventh comparing element NA44 compares the input potential levels to determine whether or not they are incident in logic level with each other. In this instance, a potential level supplied from the first delay line 11 is consistent in logic level with the corresponding potential level supplied from the second delay line 12 around a certain timing after lapse of time equal to the half of the pulse repetition period from the leading edge of the clock pulse CLK10-2, and the comparator 14 produces the control signal CTL11.

The current supplier 16a has already charged the output clock signal line 16b, and the control signal CTL11 causes the associated n-channel enhancement type switching transistor to turn on. Then, the output clock signal line 16b changes the potential level on the output clock signal line 16b to the low level, and the wired-OR gate 16 changes the output clock signal CLK11 at the certain timing.

If the delay circuit is hierarchically multiplied, the delay circuit produces an output pulse signal at another timing ¼, 3/4, ... of the pulse repetition period of the input clock signal.

As will be appreciated from the foregoing description, the certain timing is determined by the comparator 14, and the output clock signal is produced after lapse of time equal to one or more than one of equal parts equally divided from the change of the input signal. For this reason, it is not necessary to previously regulate the difference in time between the first delay line and the second delay line to the half of the pulse repetition period.

The NAND gates and the NOR gates form the first delay line 11, the second delay line 12, the transfer circuit 13 and the essential part of the cornparator 14, and, for this reason, the piece of delay to be introduced in the signal propagation is easily calculable.

Although a particular embodiment of the present invention has been shown and described, it will be obvious to those skilled in the art that various changes and modifications may be made without departing from the spirit and scope of the present invention.

For example, the current supplier 16a may be replaced with a resistor.

The above-described embodiment is fabricated on the basis of the NAND function. Another delay circuit may be fabricated on the basis of the NOR function.

The above-described embodiment compares the potential levels supplied from the first delay line 11 with the potential levels supplied from the second delay line 12 for the certain timing. Another delay circuit may detect the certain timing by using the pulse edge.

The delay circuit may be fabricated on a part of a semiconductor integrated circuit device.

What is claimed is:

1. A delay circuit for producing an output timing signal from an input signal, comprising:

a first delay line having a first node group implemented by a plurality of first nodes connected in series, and propagating said input signal from an initial node of said first node group toward a final node of said first node group;

a second delay line having a second node group implemented by a plurality of second nodes connected in series, and propagating said input signal from an initial node of said second node group toward a final node of said second node group, said initial node to said final node of said first node group being respectively paired with said final node to said initial node of said second node group so as to form a plurality of node pairs;

a comparator connected to said plurality of node pairs, and comparing output of said plurality of node pairs to determine whether the outputs of any one of said plurality of node pairs are consistent with each other so as to determine a timing for producing said output timing signal; and a transfer circuit connected between said first delay line and said second delay line for transferring said input signal from said first delay line to said second delay line.

2. The delay circuit as set forth in claim 1, in which said transfer circuit includes a plurality of transfer elements having respective input nodes respectively connected to said initial node to said final node of said first node group and respective output nodes respectively connected to said final node to said first node of said second node group.

3. A delay circuit for producing an output timing signal from an input signal, comprising:

a first delay line having a first node group implemented by a plurality of first nodes connected in series, and propagating said input signal from an initial node of said first node group toward a final node of said first node group;

a second delay line having a second node group implemented by a plurality of second nodes connected in series, and propagating said input signal from an initial node of said second node group toward a final node of said second node group, said initial node to said final node of said first node group being respectively paired with said final node to said initial node of said second node group so as to form a plurality of node pairs;

a comparator connected to said plurality of node pairs, and comparing output of said plurality of node pairs to determine whether the outputs of any one of said plurality of node pairs are consistent with each other so as to determine a timing for producing said output timing signal;

wherein said first delay line and said second delay line respectively include a plurality of first delay elements connected in series and a plurality of second delay elements connected in series, and output nodes of said plurality of first delay elements and output nodes of said plurality of second delay elements serve as said plurality of first nodes and said plurality of second nodes, respectfully, the delay circuit further comprising a transfer circuit including a plurality of transfer elements having respective input nodes respectively connected to the output node of a first delay element serving as said initial node to the output nodes of another first delay element serving as said final node and respective output nodes respectively connected to an input node of a second delay element with the output node serving as said final node to an input node of another second delay element with the output node serving as said initial node.

4. The delay circuit as set forth in claim 3, in which said input signal is periodically changed between a first potential level and a second potential level, and said transfer circuit electrically connects said output nodes of said plurality of first delay elements to the input nodes of said plurality of second delay elements when said input signal is changed from said first level to said second level.

5. The delay circuit as set forth in claim 4, further comprising an OR circuit connected to said comparator for producing said output timing signal at said timing determined by said comparator.

6. The delay circuit as set forth in claim 5, in which said comparator includes a plurality of comparing elements connected to said plurality of node pairs, and said OR circuit has input nodes respectively connected to output nodes of said comparing elements.

7. The delay circuit as set forth in claim 6, in which a first kind of logic gate and a second kind of logic gate form said first delay line, said second delay line, said comparator and said transfer circuit.

8. The delay circuit as set forth in claim 7, in which said first delay line includes a plurality of first kind of logic gates and a plurality of second kind of logic gates alternately arranged with said plurality of first kind of logic gates, and said second delay line includes another plurality of first kind of logic gates and another plurality of second kind of logic gates alternately arranged with said another plurality of first kind of logic gates, an output node of one of said plurality of first kind of logic gates and an output node of one of said plurality of second kind of logic gates serving as said initial node of said first node group and said final node of said first node group, respectively, an output node of one of said another plurality of first kind of logic gates and an output node of one of said another plurality of second kind of logic gates serving as said initial node of said second node group and said final node of said second node group, respectively.

9. The delay circuit as set forth in claim 8, in which said first kind of logic gate and said second kind of logic gate are a NAND gate and a NOR gate, respectively.

10. The delay circuit as set forth in claim 7, in which a first combination of said first kind of logic gates and said second kind of logic gates, a second combination of said first kind of logic gates and said second kind of logic gates, a third combination of said first kind of logic gates and said second kind of logic gates and a fourth combination of said first kind of logic gates, said second kind of logic gates and a third kind of logic gates form said first delay line, said second delay line, said transfer circuit and said comparator, respectively.

11. The delay circuit as set forth in claim 10, in which said first kind of logic gate, said second kind of logic gate and said third kind of logic gate achieve a NAND operation, a NOR operation and a NOT operation, respectively.

12. The delay circuit as set forth in claim 11, in which a first series combination of NAND gates and NOR gates alternated with said NAND gates serves as said first delay line, a second series combination of NAND gates and NOR gates alternated with said NAND gates serves as said second delay line, a first parallel combination of NAND gates and NOR gates alternated with said NAND gates serves as said transfer circuit, and a second parallel combination of NAND gates and OR gates alternated with said NAND gates and inverters connected in series to said NAND gates serve as said comparator.

13. The delay circuit as set forth in claim 12, in which the logic gates incorporated in said first delay line is equal in number to the logic gates incorporated in said second delay line, and said output timing signal is produced after a lapse of time measured from the change of said input signal to said second level and equal to a half of a pulse repetition period of said input signal.

14. The delay circuit as set forth in claim 13, in which said NAND gates of said transfer circuit and said NOR gates of said transfer circuit are enabled with said input signal of said second level and a complementary signal of said input signal, respectively, the output nodes of said NAND gates of said first delay line and the output nodes of said NOR gates of said first delay line are connected to respective input nodes of said NOR gates of said transfer circuit and respective input nodes of said NAND gates of said transfer circuit, respectively, and the output nodes of said NAND gates of said transfer circuit and the output nodes of said NOR gates of said transfer circuit are connected to respective input nodes of said NAND gates of said second delay line and respective input nodes of said NOR gates of said second delay line, respectively.

15. The delay circuit as set forth in claim 14, in which the output nodes of said NOR gates of said first delay line and the output nodes of said NAND gates of said first delay line are further connected to first input nodes of said NAND gates of said comparator and first input nodes of said NOR gates of said comparator, respectively, and the output nodes of said NAND gates of said second delay line and the output nodes of said NOR gates of said second delay line are further connected to second input nodes of said NAND gates of said comparator and second input nodes of said NOR gates of said comparator, respectively.

16. The delay circuit as set forth in claim 15, in which said NOR gates of said transfer circuit and said NAND gates of said transfer circuit supply an enable signal to selected NOR gates of said first delay line and selected NAND gates of said first delay line.

* * * * *